(12) United States Patent
Kang

(10) Patent No.: US 9,954,038 B2
(45) Date of Patent: Apr. 24, 2018

(54) ORGANIC LIGHT-EMITTING DEVICE HAVING A PEROVSKITE STRUCTURE IN A CHARGE GENERATION LAYER

(71) Applicant: SAMSUNG DISPLAY CO., LTD., Yongin-si, Gyeonggi-do (KR)

(72) Inventor: Namsu Kang, Seoul (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/641,563

(22) Filed: Jul. 5, 2017

(65) Prior Publication Data

US 2018/0026084 A1    Jan. 25, 2018

(30) Foreign Application Priority Data

Jul. 19, 2016  (KR) .......................... 10-2016-0091558

(51) Int. Cl.
*H01L 27/32* (2006.01)
*H01L 51/00* (2006.01)
*H01L 51/50* (2006.01)

(52) U.S. Cl.
CPC ...... *H01L 27/3244* (2013.01); *H01L 27/3211* (2013.01); *H01L 51/005* (2013.01); *H01L 51/5056* (2013.01); *H01L 51/5072* (2013.01); *H01L 51/5088* (2013.01); *H01L 51/5092* (2013.01)

(58) Field of Classification Search
CPC ............ H01L 27/3206; H01L 27/3209; H01L 27/3211; H01L 51/5066; H01L 51/5072; H01L 51/5092; H01L 51/5088; H01L 51/5084

See application file for complete search history.

(56) References Cited

U.S. PATENT DOCUMENTS

| | | |
|---|---|---|
| 2006/0279203 A1 | 12/2006 | Forrest et al. |
| 2011/0248249 A1 | 10/2011 | Forrest et al. |
| 2013/0153881 A1* | 6/2013 | Tokoo ................. H01L 51/5016 257/40 |
| 2014/0361271 A1 | 12/2014 | Forrest et al. |
| 2015/0060825 A1 | 3/2015 | Song et al. |
| 2015/0280159 A1 | 10/2015 | Kim et al. |
| 2015/0287950 A1 | 10/2015 | Forrest et al. |

FOREIGN PATENT DOCUMENTS

| | | |
|---|---|---|
| CN | 104795505 A | 7/2015 |
| KR | 10-1232766 B1 | 2/2013 |
| KR | 10-1316752 B1 | 9/2013 |
| KR | 10-2016-0023992 A | 3/2016 |

\* cited by examiner

*Primary Examiner* — Hoai V Pham
(74) *Attorney, Agent, or Firm* — Lee & Morse, P.C.

(57) ABSTRACT

An organic light-emitting device according to an embodiment of the present disclosure includes a first electrode, a second electrode opposite to the first electrode, a first light-emitter on the first electrode to emit first light of a first wavelength range, a second light-emitter between the first light-emitter and the second electrode, to emit second light of a second wavelength range, and a charge generation layer which includes a metal compound having a perovskite structure, is between the first light-emitter and the second light-emitter, and is to generate charges to provide to each of the first light-emitter and the second light-emitter.

14 Claims, 10 Drawing Sheets

US 9,954,038 B2

ORGANIC LIGHT-EMITTING DEVICE HAVING A PEROVSKITE STRUCTURE IN A CHARGE GENERATION LAYER

CROSS-REFERENCE TO RELATED APPLICATION

Korean Patent Application No. 10-2016-0091558, filed on Jul. 19, 2016, in the Korean Intellectual Property Office, and entitled: "Organic Light-Emitting Device," is incorporated by reference herein in its entirety.

BACKGROUND

1. Field

The present disclosure herein relates to organic light-emitting devices, and more particularly, to white-light organic light-emitting devices.

2. Description of the Related Art

An organic light-emitting device is a self-emissive device which has fast response time and is operated at a low voltage. Accordingly, an organic light-emitting display apparatus including the organic light-emitting device has many advantages, for example, a thin and lightweight display apparatus may be manufactured because a separate light source may be omitted, contrast is excellent, and there is no viewing angle dependency.

An organic light-emitting device is a display device which has an emission layer formed of an organic material between an anode and a cathode. Holes provided from the anode and electrons provided from the cathode are combined in the emission layer to form excitons, and light corresponding to energy between the hole and the electron is then emitted from the exciton.

The organic light-emitting device may include a white-light organic light-emitting device having high luminous efficiency. The white-light organic light-emitting device may include different light-emitting units, which respectively emit red light, blue light, and green light, in the emission layer.

SUMMARY

An embodiment of the present disclosure provides an organic light-emitting device including a first electrode, a second electrode opposite to the first electrode, a first light-emitter on the first electrode and emits first light of a first wavelength range, a second light-emitter between the first light-emitter and the second electrode, and emits second light of a second wavelength range, and a charge generation layer which includes a metal compound having a perovskite structure, between the first light-emitter and the second light-emitter, and to generate charges to provide to each of the first light-emitter and the second light-emitter.

In an embodiment, the charges may include electrons and holes, the charge generation layer may include a first charge generation layer to provide the electrons to the first light-emitter and a second charge generation layer to provide the holes to the second light-emitter, and the metal compound may be included in the first charge generation layer.

In an embodiment, the first charge generation layer may further include at least one of a metal chelate compound, an oxadiazole dendrimer-based compound, an oxadiazole-based compound, an azole-based compound, a benzimidazole-based compound, a pyridine-based compound, a quinoline-based compound, an anthrazoline-based compound, a silole-based compound, or a cyan-based compound.

In an embodiment, the first charge generation layer may further include at least one of magnesium (Mg), aluminum (Al), lithium (Li), calcium (Ca), silver (Ag), gold (Au), CaO, $MoO_x$, $TiO_x$, or $ZnO_x$ (where x is a natural number selected from 2 and 3).

In an embodiment, the first light-emitter may include a first emission layer configured to emit the first light, a first hole transport region provided between the first electrode and the first emission layer, and a first electron transport region provided on the first emission layer, and the second light-emitter may include a second emission layer to emit the second light, a second hole transport region provided between the charge generation layer and the second emission layer, and a second electron transport region provided between the second electrode and the second emission layer.

In an embodiment, the first electron transport region may include a first electron injection layer adjacent to the charge generation layer and a first electron transport layer between the first electron injection layer and the first emission layer, and the second electron transport region may include a second electron injection layer adjacent to the second electrode and a second electron transport layer between the second electron injection layer and the second emission layer.

In an embodiment, the second electron injection layer may include the metal compound.

In an embodiment, the metal compound may include at least one of $CH_3NH_3PbBr_3$, $CH_3NH_3PbI_3$, $CH_3NH_3RbYbI_3$, $CH_3NH_3CSRbI_3$, or $CH_3NH_3CSYbI_3$.

In an embodiment of the present disclosure, an organic light-emitting device includes a first electrode; a second electrode opposite to the first electrode, a first light-emitter on the first electrode and emits first light of a first wavelength range, a second light-emitter on the first light-emitter and emits second light of a second wavelength range, a third light-emitter between the second light-emitter and the second electrode and emits light of a third wavelength range, a first intermediate layer between the first light-emitter and the second light-emitter, and a second intermediate layer between the second light-emitter and the third light-emitter, wherein at least one of the first intermediate layer or the second intermediate layer includes a metal compound having a perovskite structure.

In an embodiment, the first intermediate layer may include a first charge generation layer which generates electrons to provide to the first light-emitter, and a second charge generation layer which generates holes to provide to the second first light-emitter, the second intermediate layer may include a third charge generation layer which generates electrons to provide to the second light-emitter, and a fourth charge generation layer which generates holes to provide to the first light-emitter, and the metal compound may be included in at least one of the first charge generation layer or the third charge generation layer.

In an embodiment, one layer in at least of the first light emitter and the second light-emitter may include the metal compound.

In an embodiment of the present disclosure, a display apparatus includes an organic light-emitting device; and a display panel provided on the organic light-emitting device, wherein the organic light-emitting device includes a first electrode; a second electrode opposite to the first electrode, a first light-emitter on the first electrode and emits first light of a first wavelength range, a second light-emitter between the first light-emitter and the second electrode and emits second light of a second wavelength range, and a charge generation layer which includes a metal compound having a perovskite structure, between the first light-emitter and the second light-emitter, and generates charges to provide to each of the first light-emitter and the second light-emitter.

In an embodiment, the charges may include electrons and holes, the charge generation layer may include a first charge generation layer to provide the electrons to the first light-emitter and a second charge generation layer to provide the holes to the second light-emitter, and the metal compound may be included in the first charge generation layer.

In an embodiment, the first light-emitter may include a first emission layer to emit the first light, a first hole transport region provided between the first electrode and the first emission layer, and a first electron transport region provided on the first emission layer, and the second light-emitter may include a second emission layer to emit the second light, a second hole transport region between the charge generation layer and the second emission layer, and a second electron transport region between the second electrode and the second emission layer.

In an embodiment, the first electron transport region may include a first electron injection layer adjacent to the charge generation layer and a first electron transport layer between the first electron injection layer and the first emission layer, and the second electron transport region may include a second electron injection layer adjacent to the second electrode and a second electron transport layer disposed between the second electron injection layer and the second emission layer.

In an embodiment, the second electron injection layer may include the metal compound.

In an embodiment, one layer in at least of the first light emitter and the second light-emitter may include the metal compound.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
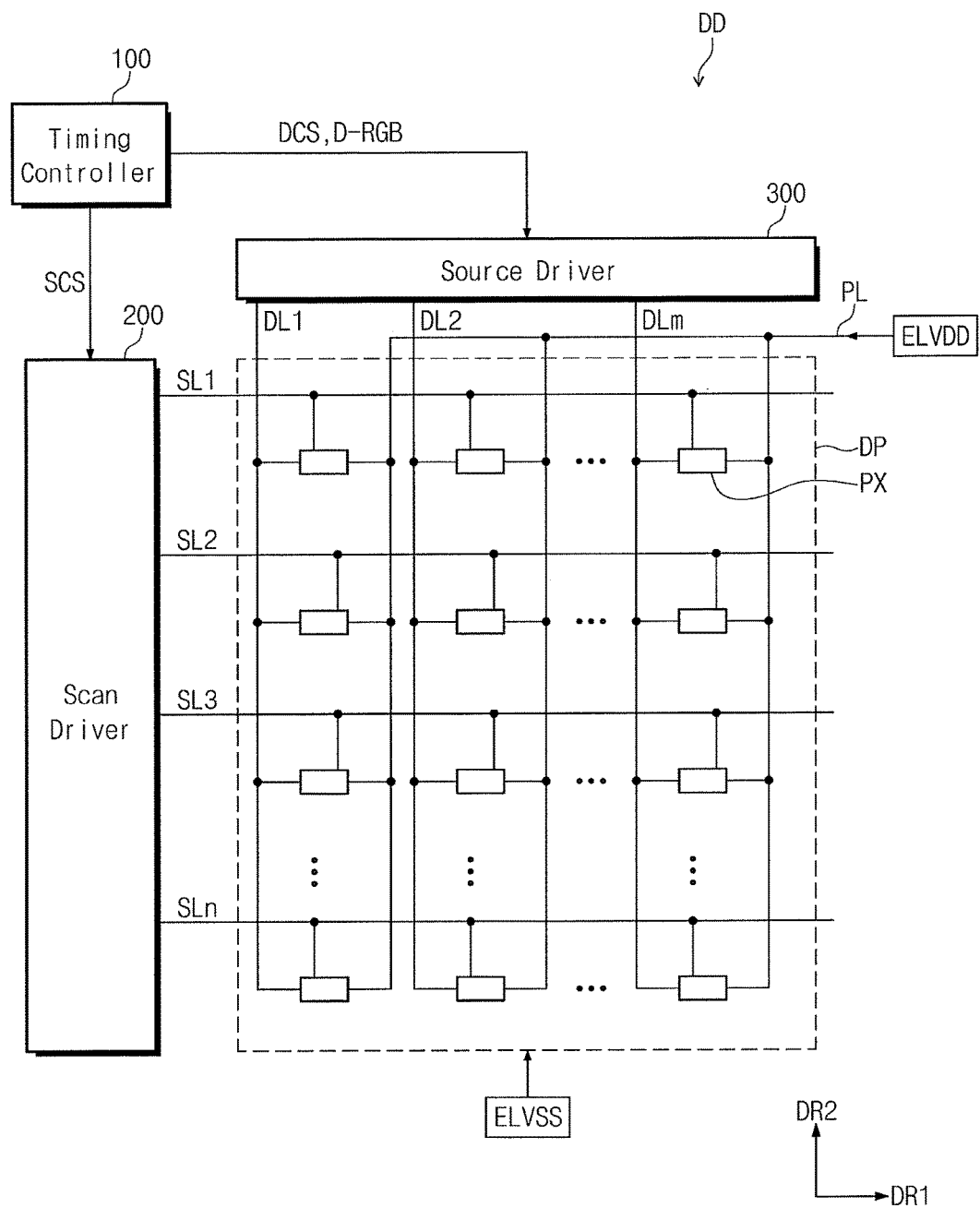
FIG. 1 illustrates a block diagram of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be further understood that the terms "includes" and/or "including", when used in this specification, specify the presence of stated features, integers, steps, operations, elements, components, or combinations thereof, but do not preclude the presence or addition of one or more other features, integers, steps, operations, elements, components, or combinations thereof. Also, it will be understood that when an element such as a layer, film, region, or substrate is referred to as being "on" another element, it can be directly on the other element or intervening elements may also be present therebetween. In contrast, when an element such as a layer, film, region, or substrate is referred to as being "under" another element, it may be directly under the other element or intervening elements may also be present. Hereinafter, embodiments of the present disclosure will be described with reference to the accompanying drawings.

Figure 2:
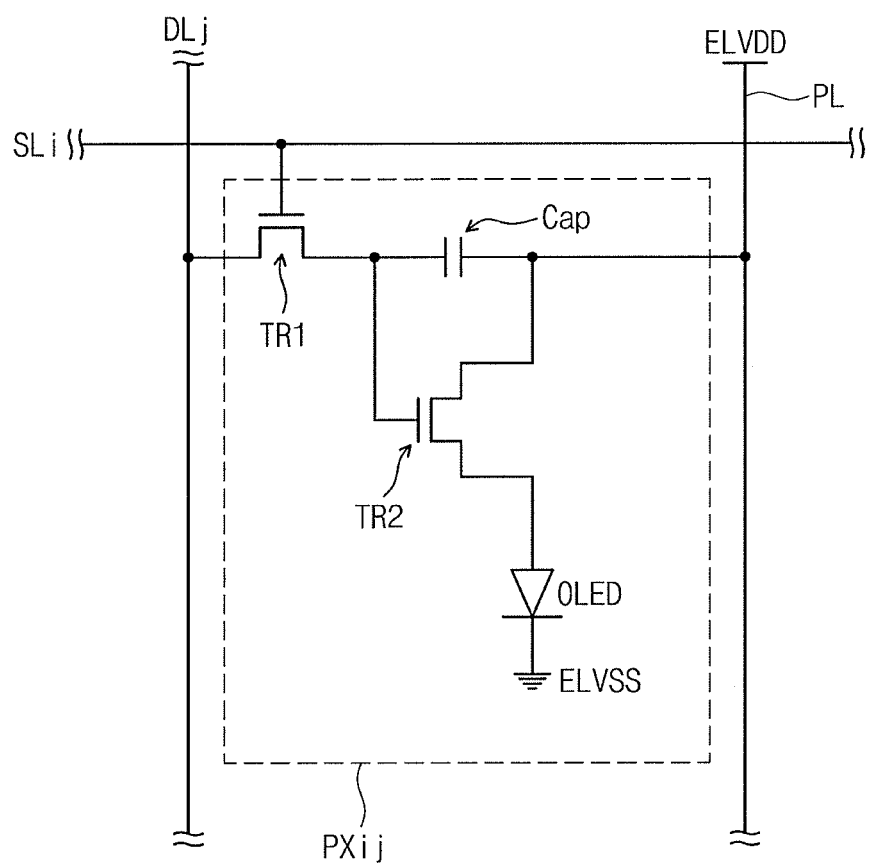
FIG. 2 illustrates a circuit diagram of a pixel according to an embodiment.

FIG. 1 is a block diagram of a display apparatus DD according to an embodiment of the present disclosure, and FIG. 2 is a circuit diagram of a pixel PXij according to an embodiment of the present disclosure. Hereinafter, the display apparatus DD according to the embodiment of the present disclosure will be described with reference to FIGS. 1 and 2.

As illustrated in FIG. 1, the display apparatus DD may include a timing controller 100, a scan driver 200, a source driver 300, and an organic light-emitting display panel DP. However, embodiments are not limited thereto, and the display apparatus DD according to the embodiment of the present disclosure may further include another driver in addition to the scan driver 200 and the source driver 300.

The timing controller 100 may receive input image signals and may generate image data D-RGB by converting a data format of the input image signals to match specification of an interface to the source driver 300. The timing controller 100 may output the image data D-RGB and various control signals DCS and SCS.

The scan driver 200 may receive the scan control signal SCS from the timing controller 100. The scan control signal SCS may include a vertical start signal starting the operation of the scan driver 200 and a clock signal determining the output times of signals. The scan driver 200 may generate gate signals in response to the scan control signal SCS and may sequentially output the gate signals to scan lines SL1 to SLn to be described later.

Although it has been illustrated in FIG. 1 that the gate signals are output from the single scan driver 200, embodiments are not limited thereto. In an embodiment of the present disclosure, the display apparatus DD may include a plurality of scan drivers. The scan drivers may output different gate signals.

The source driver 300 may receive the data control signal DCS and the image data D-RGB from the timing controller 100. The source driver 300 may convert the image data D-RGB into the data signals and may output the data signals to source lines DL1 to DLm to be described later. The data signals are analog voltages respectively corresponding to gray scale values of the image data D-RGB.

The organic light-emitting display panel DP may include the scan lines SL1 to SLn, the source lines DL1 to DLm, and pixels PX. The scan lines SL1 to SLn may extend along a first directional axis DR1 and may be arranged along a second directional axis DR2 crossing the first directional axis DR1. The source lines DL1 to DLm may be insulated from and may intersect the scan lines SL1 to SLn. However, embodiments are not limited thereto, and the organic light-emitting display panel DP according to an embodiment of the present disclosure may further include signal lines which are dependent on a circuit configuration of the pixels PX to provide signals different from the gate signals and data signals to the pixels PX.

Each of the pixels PX may be connected to a corresponding scan line among the scan lines SL1 to SLn and a corresponding source line among the source lines DL1 to DLm. Each of the pixels PX may receive a first voltage ELVDD and a second voltage ELVSS having a lower level than the first voltage ELVDD. Each of the pixels PX may be connected to a power line PL to which the first voltage ELVDD is applied.

FIG. 2 exemplarily illustrates an equivalent circuit diagram of the single pixel PXij connected to an i-th scan line SLi and a j-th source line DLj. Although not shown separately, other pixels PX illustrated in FIG. 1 may also have the same equivalent circuit.

As illustrated in FIG. 2, the pixel PXij may include at least one transistor TR1 or TR2, at least one capacitor Cap, and an organic light-emitting device OLED. Although a pixel driving circuit including two transistors TR1 and TR2 and one capacitor Cap has been exemplarily illustrated, the configuration of the pixel driving circuit is not limited thereto.

The first transistor TR1 may include a control electrode connected to the scan line SLi, an input electrode connected to the data line DLj, and an output electrode. The first transistor TR1 may output a data signal applied to the j-th source line DLj in response to a gate signal applied to the i-th scan line SLi. The capacitor Cap may include a first capacitor electrode connected to the first transistor TR1 and a second capacitor electrode receiving the first voltage ELVDD. The capacitor Cap may charge an amount corresponding to a difference between a voltage corresponding to the data signal received from the first transistor TR1 and the first voltage ELVDD.

The second transistor TR2 may include the output electrode of the first transistor TR1, a control electrode connected to the first capacitor electrode of the capacitor Cap, an input electrode receiving the first voltage ELVDD, and an output electrode. The output electrode of the second transistor TR2 may be connected to the organic light-emitting device OLED.

The second transistor TR2 may control a driving current flowing in the organic light-emitting device OLED in accordance with the amount of charge stored in the capacitor Cap. Turn-on time of the second transistor TR2 may be determined according to the amount of charge stored in the capacitor Cap. Substantially, the output electrode of the second transistor TR2 may provide a voltage having a level lower than the first voltage ELVDD to the organic light-emitting device OLED.

The organic light-emitting device OLED may be connected to the second transistor TR2 and may receive the second voltage ELVSS. The organic light-emitting device OLED may emit light during a turn-on interval of the second transistor TR2.

The organic light-emitting device OLED may include a light-emitting material and may generate light having a color corresponding to the light-emitting material. Detailed descriptions of the organic light-emitting device OLED will be described later.

Figure 3:
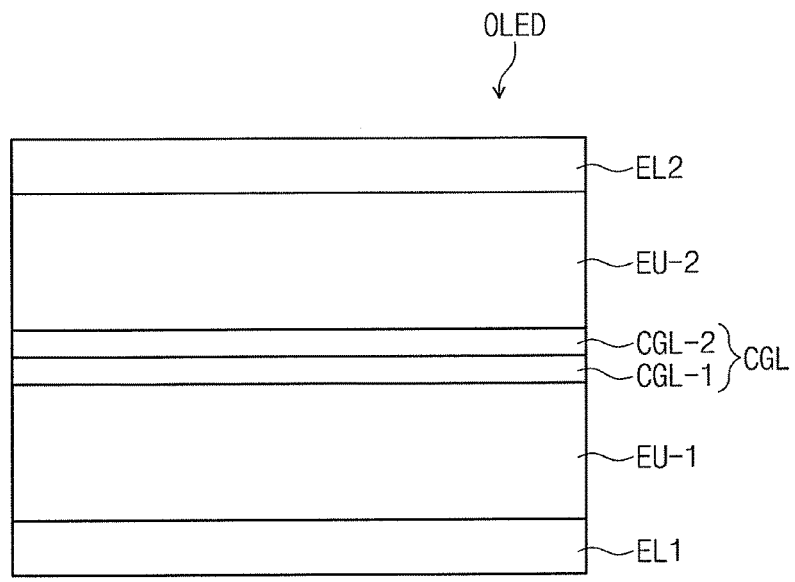
FIG. 3 illustrates a cross-sectional view schematically illustrating an organic light-emitting device according to an embodiment.
Figure 3:
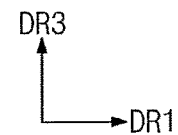
Figure 4:
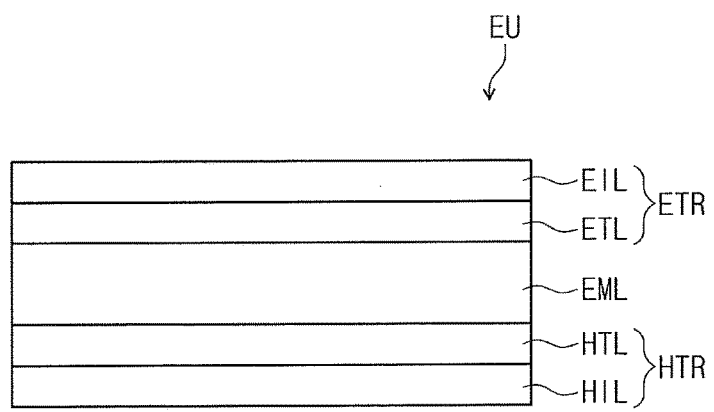
FIG. 4 illustrates a cross-sectional view illustrating a light-emitting unit according to an embodiment.
Figure 4:
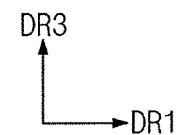

FIG. 3 is a cross-sectional view schematically illustrating the organic light-emitting device OLED according to an embodiment of the present disclosure. FIG. 4 is a cross-sectional view illustrating a light-emitting unit EU according to an embodiment of the present disclosure.

Referring to FIG. 3, the organic light-emitting device OLED according to the embodiment of the present disclosure may include a first electrode EL1, a first light-emitting unit EU-1, a charge generation layer CGL, a second light-emitting unit EU-2, and a second electrode EL2 which are sequentially stacked in a third direction DR3. Although not shown in FIG. 3, the organic light-emitting device OLED may be disposed on a base substrate. The base substrate may be formed of thin films including the first transistor TR1, the second transistor TR2, the capacitor Cap, and insulation layers disposed between the first transistor TR1, the second transistor TR2, and the capacitor Cap.

The first electrode EL1 may be, e.g., a pixel electrode or an anode. The first electrode EL1 may be a transmissive electrode, a transflective electrode, or a reflective electrode. In an embodiment, the first electrode EL1 may be a transflective electrode or a reflective electrode for top emission. In this case, the first electrode EL1 may include silver (Ag), magnesium (Mg), aluminum (Al), platinum (Pt), palladium (Pd), gold (Au), nickel (Ni), neodymium (Nd), iridium (Ir), chromium (Cr), or a mixture of metals. Also, the first electrode EL1 may be a single layer including Ag, Mg, Al, Pt, Pd, Au, Ni, Nd, Ir, Cr, or a mixture of metals, or may have a multilayered structure having a metal layer including Ag, Mg, Al, Pt, Pd, Au, Ni, Nd, Ir, Cr, or a mixture of metals and a transparent conductive oxide layer including a transparent conductive oxide. Herein, the transparent conductive oxide, for example, may include indium tin oxide (ITO), indium zinc oxide (IZO), zinc oxide (ZnO), and indium tin zinc oxide (ITZO).

Alternatively, in an embodiment of the present disclosure, the first electrode EL1 may be a transmissive electrode for bottom emission. In this case, the first electrode EL1 may be formed of a transparent conductive oxide, e.g., ITO, IZO, ZnO, and ITZO. The first electrode EL1 may be a single layer of the transparent metal oxide or may have a multilayered structure.

The second electrode EL2 may be disposed opposite to the first electrode EL1. For example, the second electrode EL2 may be a common electrode or a cathode. The second electrode EL2 may be a transmissive electrode, a transflective electrode, or a reflective electrode. In an embodiment, the second electrode EL2 may be a transmissive electrode for top emission. In this case, the second electrode EL2 may include lithium (Li), calcium (Ca), LiF/Ca, LiF/Al, Al, Mg, BaF, barium (Ba), Ag, or a compound or mixture thereof (e.g., mixture of Ag and Mg). Also, the second electrode EL2 may be formed of a transparent conductive oxide, e.g., ITO, IZO, ZnO, and ITZO. Alternatively, in an embodiment of the present disclosure, the second electrode EL2 may be a transflective electrode or a reflective electrode for bottom emission. In this case, the second electrode EL2 may include Ag, Mg, Al, Pt, Pd, Au, Ni, Nd, Ir, Cr, or a mixture of metals. Furthermore, the second electrode EL2 may have a multi-layer structure including a reflective layer or a transflective layer formed of the above materials and a transparent conductive layer formed of ITO, IZO, ZnO, or ITZO.

The organic light-emitting device OLED according to the embodiment of the present disclosure may be a top emission type. In this case, the first electrode EL1 may be a reflective electrode, and the second electrode EL2 may be a transmissive electrode. The top emission type display provides a high aperture ratio.

The organic light-emitting device OLED according to the embodiment of the present disclosure may include the plurality of light-emitting units EU between the first electrode EL1 and the second electrode EL2. Each of the plurality of light-emitting units EU may emit light having different wavelength ranges. For example, the first light-emitting unit EU-1 may emit light of a first wavelength range and the second light-emitting unit EU-2 may emit light of a second wavelength range. Although the first light-emitting unit EU-1 and the second light-emitting unit EU-2 have only been illustrated in FIG. 3, three light-emitting units EU may be disposed between the first electrode EL1 and the second electrode EL2. This will be described later with reference to FIGS. 6A and 6B. According to an embodiment of the present disclosure, the number or stacking sequence of the light-emitting units EU disposed between the first electrode EL1 and the second electrode EL2 is not particularly limited as long as light respectively emitted from the light-emitting units EU are mixed to generate white light.

Specifically, as illustrated in FIG. 4, each of the first light-emitting unit EU-1 and the second light-emitting unit EU-2, generically referred to therein as EU, may include a hole transport region HTR, an electron transport region ETR, and an emission layer EML between the hole transport region HTR and the electron transport region ETR.

The hole transport region HTR according to an embodiment of the present disclosure may include at least one of a hole injection layer HIL or a hole transport layer HTL. Although not shown in FIG. 4, the hole transport layer HTL may include at least one of a hole buffer layer or an electron blocking layer.

The hole transport region HTR may be a single layer formed of a single material, may be a single layer formed of a plurality of different materials, or may have a multilayered structure having a plurality of layers which is formed of a plurality of different materials. For example, as illustrated in FIG. 4, the hole transport region HTR may have a structure in which the hole injection layer HIL and the hole transport layer HTL are sequentially stacked in a third direction DR3. However, the embodiment of the present disclosure is not limited thereto, and the hole transport region HTR may be formed in various stacked structures such as hole injection layer/hole transport layer/hole buffer layer, hole injection layer/hole buffer layer, hole transport layer/hole buffer layer, or hole injection layer/hole transport layer/electron blocking layer, which are respectively sequentially stacked in the third direction DR3.

The hole transport region HTR may be formed by using a typical method known in the art. For example, the hole transport region HTR may be formed by using methods such as a vacuum deposition method, a spin coating method, a casting method, a Langmuir-Blodgett (LB) method, an inkjet printing method, a laser printing method, and a laser induced thermal imaging (LITI) method.

As illustrated in FIG. 4, in a case in which the hole transport region HTR includes the hole injection layer HIL, the hole transport region HTR may include a phthalocyanine compound, e.g., copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenyl phenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), or (polyaniline)/poly(4-styrenesulfonate) (PANI/PSS), but embodiments are not limited thereto.

When the hole transport region HTR includes the hole transport layer HTL as illustrated in FIG. 4, the hole transport region HTR may include a carbazole-based derivative, such as N-phenyl carbazole and polyvinyl carbazole, a fluorine-based derivative, a triphenylamine-based derivative, such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N-di(1-naphthyl)-N,N'-diphenylbenzidine (NPB), or 4,4'-cyclohexylidene bis[N,N-bis(4-methylphenyl)benzenamine] (TAPC), but embodiments are not limited thereto.

A thickness of the hole transport region HTR, e.g., may be in a range of about 100 Å to about 10,000 Å or about 100 Å to about 1,000 Å. When the hole transport region HTR includes both the hole injection layer HIL and the hole transport layer HTL, a thickness of the hole injection layer HIL, for example, may be in a range of about 100 Å to about 10,000 Å or about 100 Å to about 1,000 Å, and a thickness of the hole transport layer HTL, for example, may be in a range of about 50 Å to about 2,000 Å or about 100 Å to about 1,500 Å. When the thicknesses of the hole transport region HTR, the hole injection layer HIL and the hole transport layer HTL satisfy the above-described ranges, satisfactory hole transport characteristics may be obtained without a substantial increase in driving voltage.

The hole transport region HTR may further include a charge generating material for improving conductivity in addition to the above-described materials. The charge generating material may be uniformly or non-uniformly dispersed in the hole transport region HTR. The charge generating material, for example, may be a p-type dopant. The p-type dopant may be one of a quinone derivative, a metal oxide, and a cyano group-containing compound, but the embodiment of the present disclosure is not limited thereto. For example, non-limiting examples of the p-type dopant may include a quinone derivative, such as tetracyanoquinodimethane (TCNQ) and 2,3,5,6-tetrafluoro-tetracyano-quinodimethane (F4-TCNQ), and a metal oxide such as tungsten oxide and molybdenum oxide, but embodiments are not limited thereto.

As described above, the hole transport region HTR may further include at least one of the hole buffer layer or the electron blocking layer, in addition to the hole injection layer HIL and the hole transport layer HTL. The hole buffer layer may increase light extraction efficiency by compensating a resonance distance according to a wavelength of light emitted from the emission layer EML. A material, which may be included in the hole transport region, may be used as a material included in the hole buffer layer. The electron blocking layer may prevent the injection of electrons from the electron transport region to be described later to the hole transport region.

The electron transport region ETR according to an embodiment of the present disclosure may include at least one of an electron injection layer EIL or an electron transport layer ETL. Although not shown in FIG. 4, the electron transport region ETR may further include a hole blocking layer.

The electron transport region ETR may be formed by using a typical method known in the art. For example, the electron transport region ETR may be formed by using methods such as a vacuum deposition method, a spin coating method, a casting method, a LB method, an inkjet printing method, a laser printing method, and a LITI method.

As illustrated in FIG. 4, in a case in which the electron transport region ETR includes the electron transport layer ETL, the electron transport region ETR may include tris(8-hydroxyquinolinato)aluminum ($Alq_3$), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) (Bebq2), 9,10-di(naphthalene-2-yl)anthracene (ADN), and a mixture thereof. A thickness of the electron transport layer ETL, for example, may be in a range of about 100 Å to about 1,000 Å or about 150 Å to about 500 Å. When the thickness of the electron transport layer ETL satisfies the above-described range, satisfactory electron transport characteristics may be obtained without a substantial increase in driving voltage.

When the electron transport region ETR includes the electron injection layer EIL as illustrated in FIG. 4, LiF, lithium quinolate (LiQ), $Li_2O$, BaO, NaCl, CsF, a lanthanide metal, such as ytterbium (Yb), or a metal halide, such as RbCl and RbI, may be used as the electron transport region ETR, but the embodiment of the present disclosure is not limited thereto. The electron injection layer EIL may also be formed of a material in which an electron transport material and an insulating organometallic salt are mixed. The organometallic salt may be a material having an energy band gap of about 4 eV or more. Specific examples of the organometallic salt may be metal acetate, metal benzoate, metal acetoacetate, metal acetylacetonate, or metal stearate. A thickness of the electron injection layer EIL, for example, may be in a range of about 1 Å to about 100 Å or about 3 Å to about 90 Å. When the thickness of the electron injection layer EIL satisfies the above-described range, satisfactory electron injection characteristics may be obtained without a substantial increase in driving voltage.

If the electron transport region ETR further includes the hole blocking layer as described above, the hole blocking layer, e.g., may include at least one of 2,9-dimethyl-4,7-diphenyl-1,10-phenanthroline (BCP) or 4,7-diphenyl-1,10-phenanthroline (Bphen). When the thickness of the hole blocking layer satisfies the above-described range, satisfactory hole blocking characteristics may be obtained without a substantial increase in driving voltage.

The emission layer EML, according to an embodiment of the present disclosure may include a host material and a dopant material. The emission layer EML may be formed by using a phosphorescent or fluorescent light-emitting material as a dopant in the host material.

The host material is not particularly limited so long as it is a material typically used in the art, and, for example, tris(8-hydroxyquinolino)aluminum ($Alq_3$), 4,4'-bis(N-carbazolyl)-1,1'-biphenyl (CBP), poly(n-vinylcabazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN) may be used.

A color of light emitted from the emission layer EML may be determined by a combination of the host material and the dopant material. For example, when the emission layer EML emits red light, the emission layer EML may include a fluorescent material including PBD:Eu(DBM)3(Phen) (tris(dibenzoylmethanato)phenanthoroline europium) or perylene. In this case, a dopant material included in the corresponding emission layer EML, e.g., may be selected from a metal complex or an organometallic complex, such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP).

When the emission layer EML emits green light, the emission layer EML may include a fluorescent material including tris(8-hydroxyquinolino)aluminum (Alq3). In this case, a dopant material included in the corresponding emission layer EML, for example, may be selected from a metal complex or an organometallic complex, e.g., fac-tris(2-phenylpyridine)iridium (Ir(ppy)3).

When the emission layer EML emits blue light, the emission layer EML may include a fluorescent material including one selected from the group consisting of spiro-DPVBi, spiro-6P, distyryl-benzene (DSB), distyryl-arylene (DSA), a polyfluorene (PFO)-based polymer, a poly(p-phenylene vinylene) (PPV)-based polymer, and a combination thereof. In this case, a dopant material included in the corresponding emission layer EML, for example, may be selected from a metal complex or an organometallic complex, e.g., (4,6-F2ppy)2Irpic.

The emission layer EML according to the embodiment of the present disclosure may be formed by using methods such as a vacuum deposition method, a spin coating method, a casting method, a LB method, an inkjet printing method, a laser printing method, and a LITI method.

The charge generation layer CGL may be disposed between the first light-emitting unit EU-1 and the second light-emitting unit EU-2 according to the embodiment of the present disclosure. The charge generation layer CGL may generate charges (electrons and holes) by forming a complex through an oxidation-reduction reaction when a voltage is applied. In addition, the charge generation layer CGL may provide the generated charges to each of the light-emitting units EU-1 and EU-2. The charge generation layer CGL may increase current efficiency generated in the single light-emitting unit EU two times, and may control the balance of the charges between the first light-emitting unit EU-1 and the second light-emitting unit EU-2.

Specifically, as illustrated in FIG. 3, the charge generation layer CGL according to an embodiment of the present disclosure may have a layer structure in which a first charge generation layer CGL-1 and a second charge generation layer CGL-2 are bonded to each other. The first charge generation layer CGL-1, e.g., may be an n-type charge generation layer adjacent to the first light-emitting unit EU1 to provide electrons to the first light-emitting unit EU1. The second charge generation layer CGL-2, e.g., may be a p-type charge generation layer adjacent to the second light-emitting unit EU2 to provide holes to the second light-emitting unit EU2. Although not shown in FIG. 3, a buffer layer may be further disposed between the first charge generation layer CGL-1 and the second charge generation layer CGL-2.

Figure 5A:
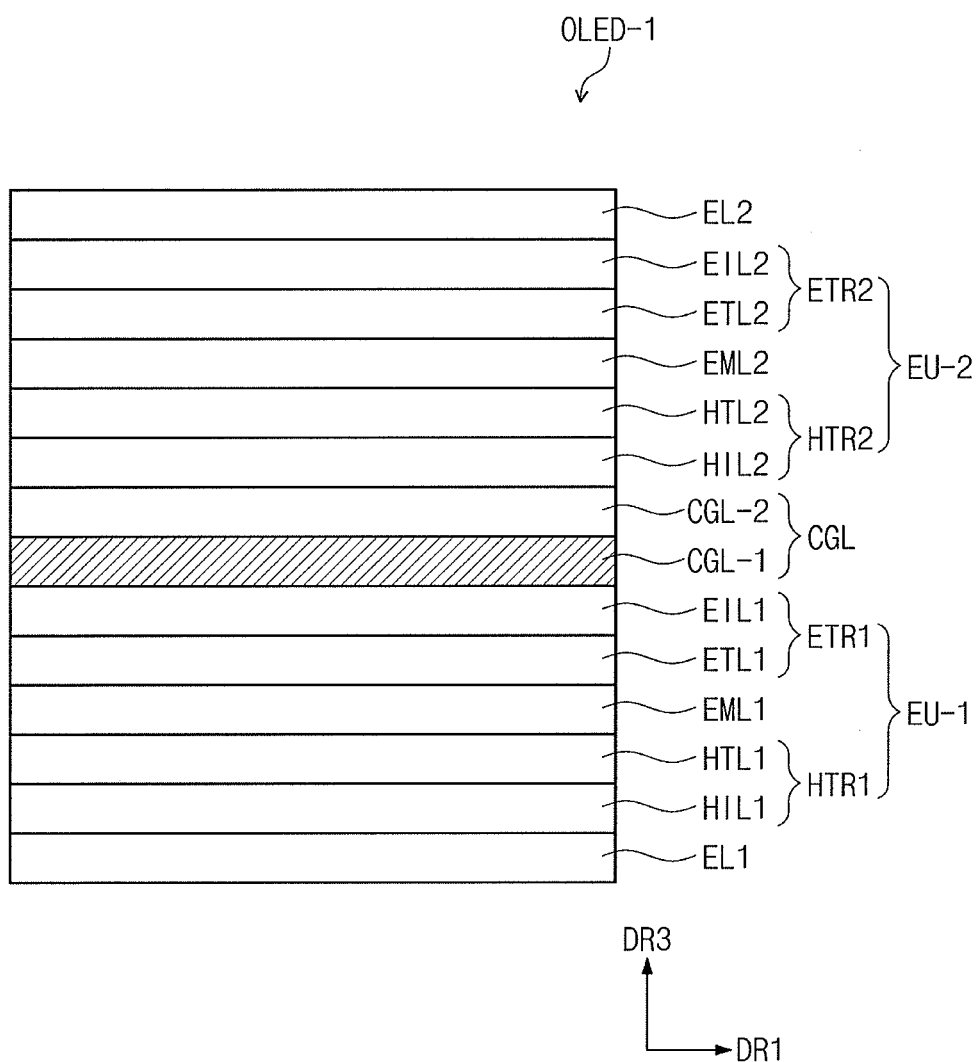
FIGS. 5A and 5B illustrate cross-sectional views illustrating a stacked structure of the organic light-emitting device according to embodiments.
Figure 5B:
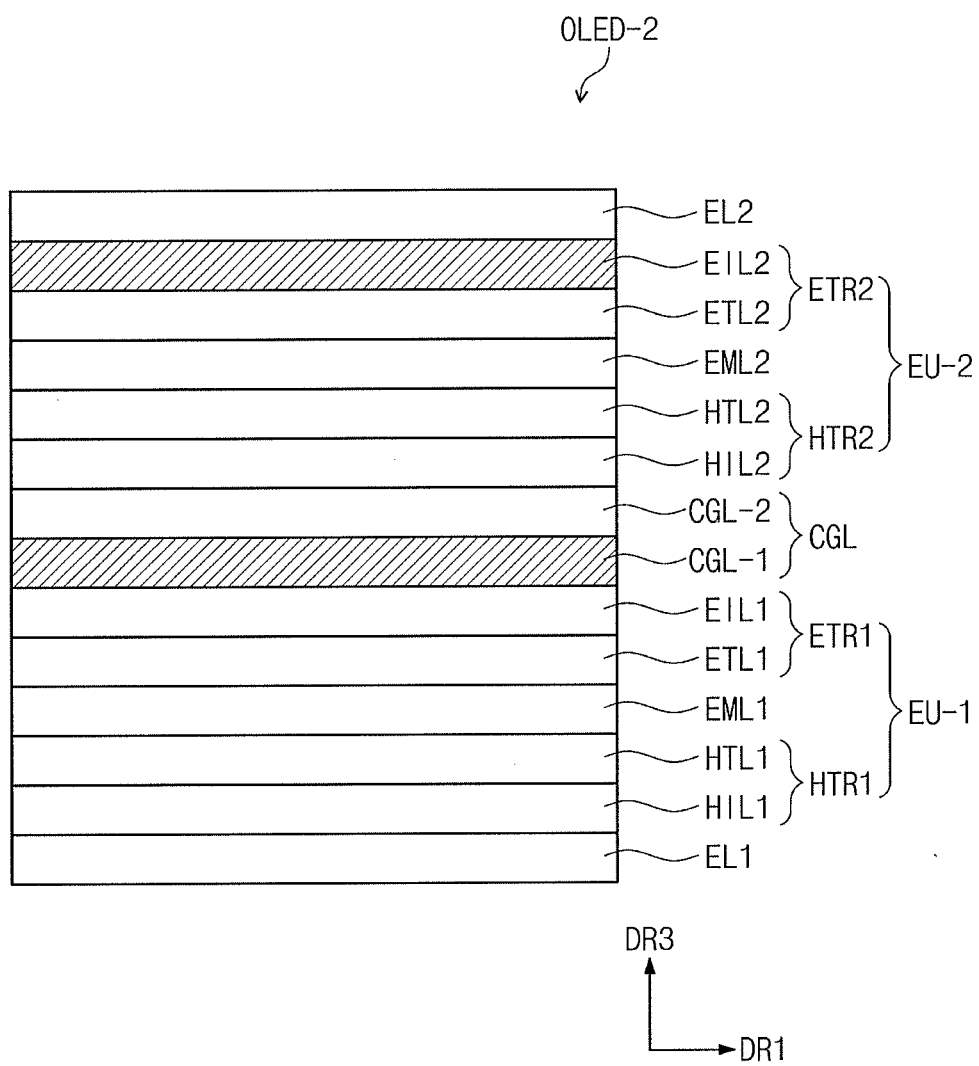

FIGS. 5A and 5B are cross-sectional views illustrating a stacked structure of the organic light-emitting device OLED according to embodiments. Referring to FIGS. 5A and 5B, the organic light-emitting device OLED according to the embodiment of the present disclosure may have a structure in which the first electrode EL1, the first light-emitting unit EU-1, the charge generation layer CGL, the second light-emitting unit EU-2, and the second electrode EL2 are sequentially stacked in the third direction DR3 as described in FIG. 3.

Specifically, the first light-emitting unit EU-1 may include a first emission layer EML1 configured to emit first light in a first wavelength range, a first hole transport region HTR1 configured to transport holes provided from the first electrode EL1 to the first emission layer EML1, and a first electron transport region ETR1 configured to transport electrons generated from the first charge generation layer CGL-1 to the first emission layer EML1.

Although it has been illustrated in FIGS. 5A and 5B that the first hole transport region HTR1 includes a first hole injection layer HIL1 and a first hole transport layer HTL1, embodiments are not limited thereto, e.g., any one of the first hole injection layer HIL1 and the first hole transport layer HTL1 may be omitted. Also, it has been illustrated in FIGS. 5A and 5B that the first electron transport region ETR1 includes a first electron injection layer EIL1 and a first electron transport layer ETL1, but embodiments are not limited thereto, e.g., any one of the electron injection layer EIL1 and the first electron transport layer ETL1 may be omitted. The first light of the first wavelength range may be blue light having a wavelength range of about 450 nm or more to about 595 nm or less.

The second light-emitting unit EU-2 may include a second emission layer EML2 configured to emit second light of a second wavelength range, a second hole transport region HTR2 configured to transport holes provided from the first charge generation layer CGL-1 to the second emission layer EML2, and a second electron transport region ETR2 configured to transport electrons generated from the second electrode EL2 to the second emission layer EML2. The second hole transport region HTR2 may include a second hole injection layer HIL2 and a second hole transport layer HTL2, and the second electron transport region ETR2 may include a second electron injection layer EIL2 and a second electron transport layer ETL2. Likewise, different from those illustrated in FIGS. 5A and 5B, any one of the second hole injection layer HIL2 and the second hole transport layer HTL2 may be omitted, and any one of the second electron injection layer EIL2 and the second electron transport layer ETL2 may be omitted. Herein, the second light in the second wavelength range may be yellow light having a wavelength range of about 570 nm or more to about 590 nm or less.

The charge generation layer CGL may include a material for controlling a polarization state of electrons and holes generated in the charge generation layer CGL and for injecting the electrons and holes into each of the adjacent light-emitting units. The charge generation layer CGL according to the embodiment of the present disclosure may include a metal compound having a perovskite structure which has a band gap energy of about 1.4 eV to about 2.2 eV and has ferroelectric properties. Hereinafter, for the simplicity of the description, the metal compound having a perovskite structure is referred to as a metal compound.

Herein, the metal compound, for example, may include $CH_3NH_3PbBr_3$, $CH_3NH_3PbI_3$, $CH_3NH_3RbYbI_3$, $CH_3NH_3CSRbI_3$, and $CH_3NH_3CSYbI_3$, but the embodiment of the present disclosure is not limited thereto. The perovskite crystal structure is as below.

[Crystal Structure]

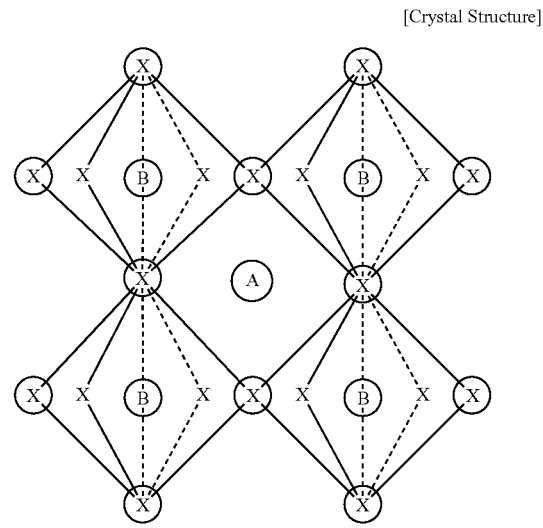

where, A, for example, may be one of $CH_3NH_3^+$, $CH_3CH_2^+$, and $CH_3OH_2^+$, B may be, e.g., one of rubidium (Rb), tin (Sn), germanium (Ge), antimony (Sb), selenium (Se), phosphorus (P), lead (Pb), and cesium (Cs), and X may be, e.g., one of iodine (I), chlorine (Cl), bromine (Br), fluorine (F), and astatine (At). Also, any one of Yb, lutetium (Lu), and radon (Rn) may be combined with X.

Specifically, as illustrated in FIG. 5A, the first charge generation layer CGL-1 according to an embodiment of the present disclosure may be formed by mixing the metal compound with other material. A thickness of the first charge generation layer CGL-1, for example, may be about 50 Å to about 500 Å. The first charge generation layer CGL-1, for example, may be formed by further including an organic compound in the metal compound. The organic compound, for example, may include at least one of a metal chelate compound, an oxadiazole dendrimer-based compound, an oxadiazole-based compound, an azole-based compound, a benzimidazole-based compound, a pyridine-based compound, a quinoline-based compound, an anthrazoline-based compound, a silole-based compound, or a cyan-based compound. Herein, the expression "A-based" denotes that an A compound or A group is included in a structure of a compound. The metal chelate compound, for example, may include $Alq_3$, Gaq, Inq, Znq, $Zn(BTZ)_2$, or $BeBq_2$. The oxadiazole-based compound, for example, may include PBD or PDPyDP. The azole-based compound, for example, may include triazole, imidazole, oxazole, thiazole, thiadiazole derivatives, TAZ, or TPBI. The benzimidazole-based compound, for example, may include TPB or F8BT.

As another example, the first charge generation layer CGL-1 may be formed by further including an inorganic compound in the metal compound. The inorganic compound, for example, may include at least one of Mg, Al, Li, Ca, Ag, Au, CaO, $MoO_x$, $TiO_x$, or $ZnO_x$ (where x is a natural number selected from 2 and 3).

Also, the organic light-emitting device OLED according to the embodiment of the present disclosure may include the metal compound in the first charge generation layer CGL-1 and the electron injection layer EIL. For example, as illustrated in FIG. 5B, the metal compound may be included in the second electron injection layer EIL2 of the second light-emitting unit EU-2 which is disposed adjacent to the second electrode EL2. However, embodiments are not limited thereto, e.g., additionally or alternatively, the metal compound may be included in the first electron injection layer EIL1 adjacent to the first charge generation layer CGL-1.

Figure 6A:
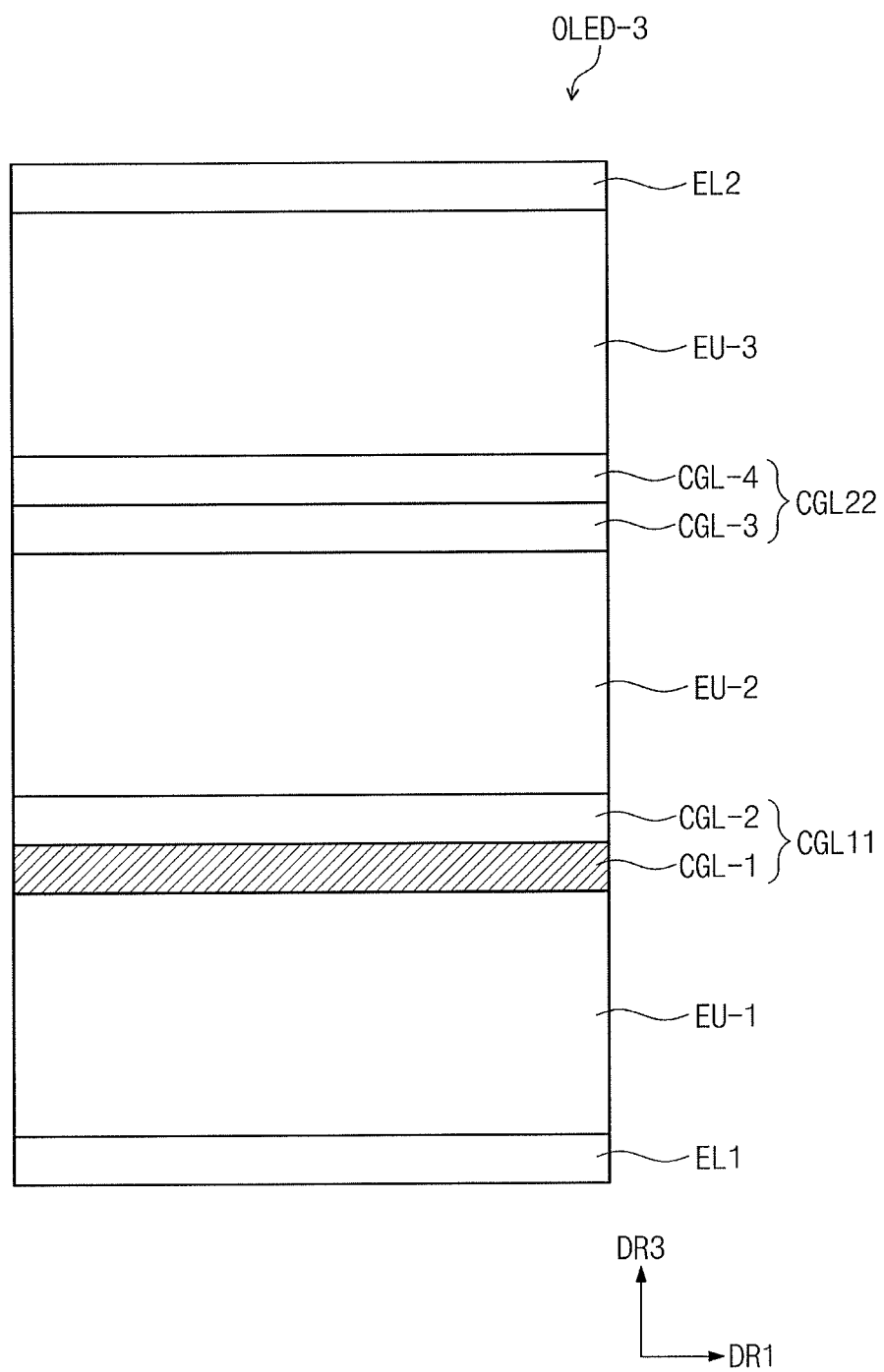
FIGS. 6A and 6B illustrate cross-sectional views illustrating organic light-emitting devices including three light-emitting units according to embodiments
Figure 6B:
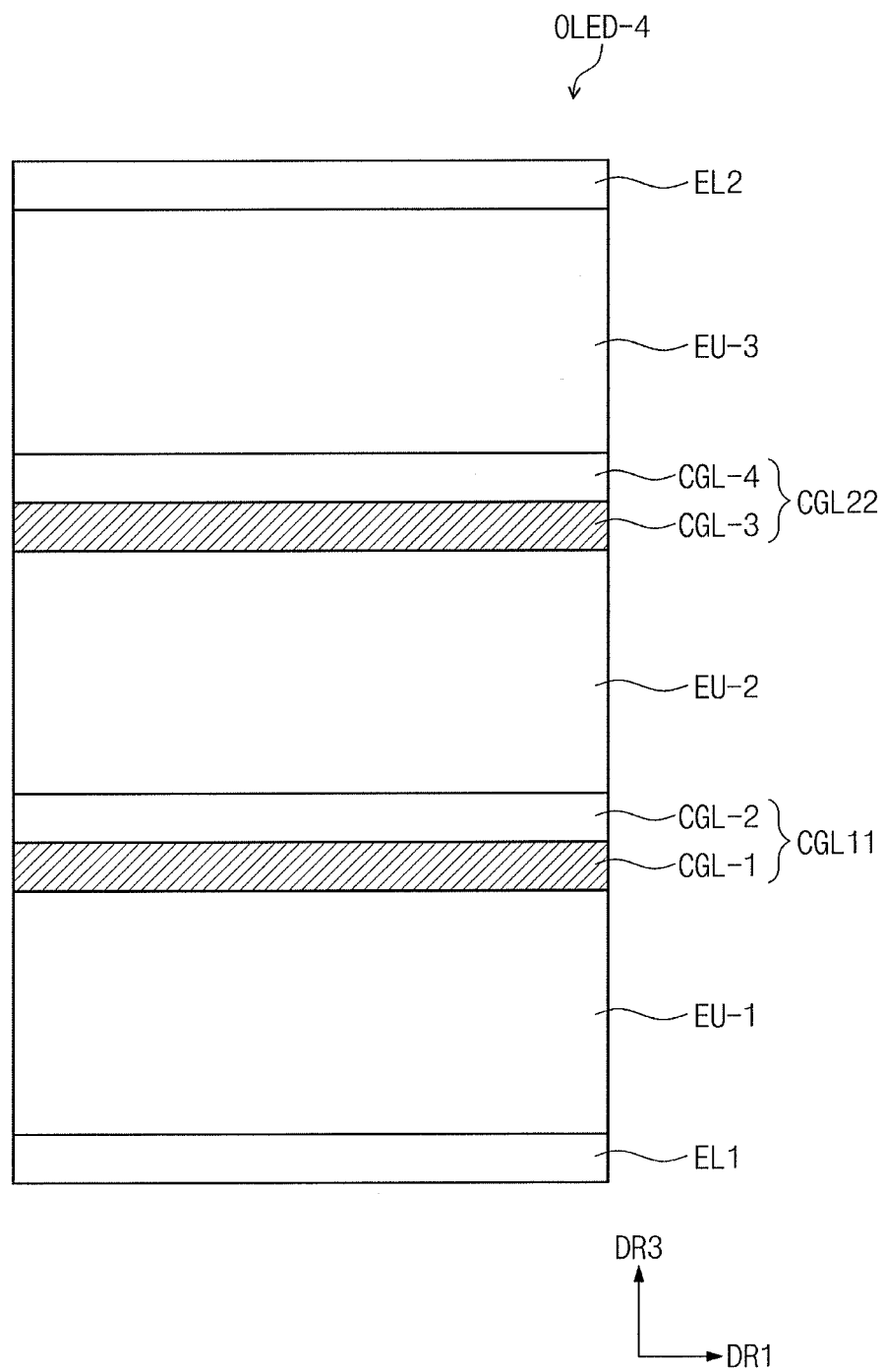

FIGS. 6A and 6B are cross-sectional views illustrating organic light-emitting devices OLED-3 and OLED-4 including three light-emitting units EU according to embodiments of the present disclosure. Descriptions of FIGS. 6A and 6B overlap with the above-described configurations will be omitted.

The organic light-emitting device OLED according to the embodiment of the present disclosure may include the three light-emitting units EU. For example, between the first electrode EL1 and the second electrode EL2, the organic light-emitting device OLED may include the first light-emitting unit EU-1, the second light-emitting unit EU-2, and a third light-emitting unit EU-3 which are stacked along a third direction DR3. Each of the first to third light-emitting units EU-1, EU-2, and EU-3 may emit light having different wavelength ranges. For example, first light of a first wavelength range emitted from the first light-emitting unit EU-1 may be blue light, second light of a second wavelength range emitted from the second light-emitting unit EU-2 may be red light, and third light of a third wavelength range emitted from the third light-emitting unit EU-3 may be green light. As another example, the first and second light may be blue lights having different wavelength ranges, and the third light may be yellow light. Similar to those described above in FIG. 4, it is sufficient that the lights respectively emitted from the first to third light-emitting units EU-1, EU-2, and EU-3 are mixed to form white light, and a color of the light is not limited to those described herein.

The organic light-emitting device OLED according to the embodiment of the present disclosure may include a first intermediate layer CGL11 between the first light-emitting unit EU-1 and the second light-emitting unit EU-2, and may include a second intermediate layer CGL22 between the second light-emitting unit EU-2 and the third light-emitting unit EU-3. Similar to the charge generation layer CGL described in FIG. 3, each of the first intermediate layer CGL11 and the second intermediate layer CGL22 may generate charges to provide to the adjacent light-emitting units EU. The metal compound according to an embodiment of the present disclosure may be included in at least one of the first intermediate layer CGL11 or the second intermediate layer CGL22.

Specifically, the first intermediate layer CGL11 may have a structure in which a first charge generation layer CGL-1, which generates electrons to provide to the first light-emitting unit EU-1, and a second charge generation layer CGL-2, which generates holes to provide to the second light-emitting unit EU-2, are bonded to each other. The second intermediate layer CGL22 may have a structure in which a third charge generation layer CGL-3, which generates electrons to provide to the second light-emitting unit EU-2, and a fourth charge generation layer CGL-4, which generates holes to provide to the third light-emitting unit EU-3, are bonded to each other.

The metal compound according to the embodiment of the present disclosure may be included at least one of the first charge generation layer CGL-1 or the third charge generation layer CGL-3. For example, as illustrated in FIG. 6A, the organic light-emitting device OLED according to the embodiment of the present disclosure may include the metal compound only in the first charge generation layer CGL-1. Alternatively, as illustrated in FIG. 6B, the organic light-emitting device OLED according to the embodiment of the present disclosure may include the metal compound in each of the first charge generation layer CGL-1 and the third charge generation layer CGL-3.

Thus, since the metal compound, which controls injection characteristics of electrons and polarization characteristics between electrons and holes, is selectively included in the charge generation layer CGL and the electron injection layer EIL, the organic light-emitting device OLED according to the embodiment of the present disclosure may improve driving efficiency and lifespan of the display apparatus DD including the organic light-emitting device OLED.

Figure 7:
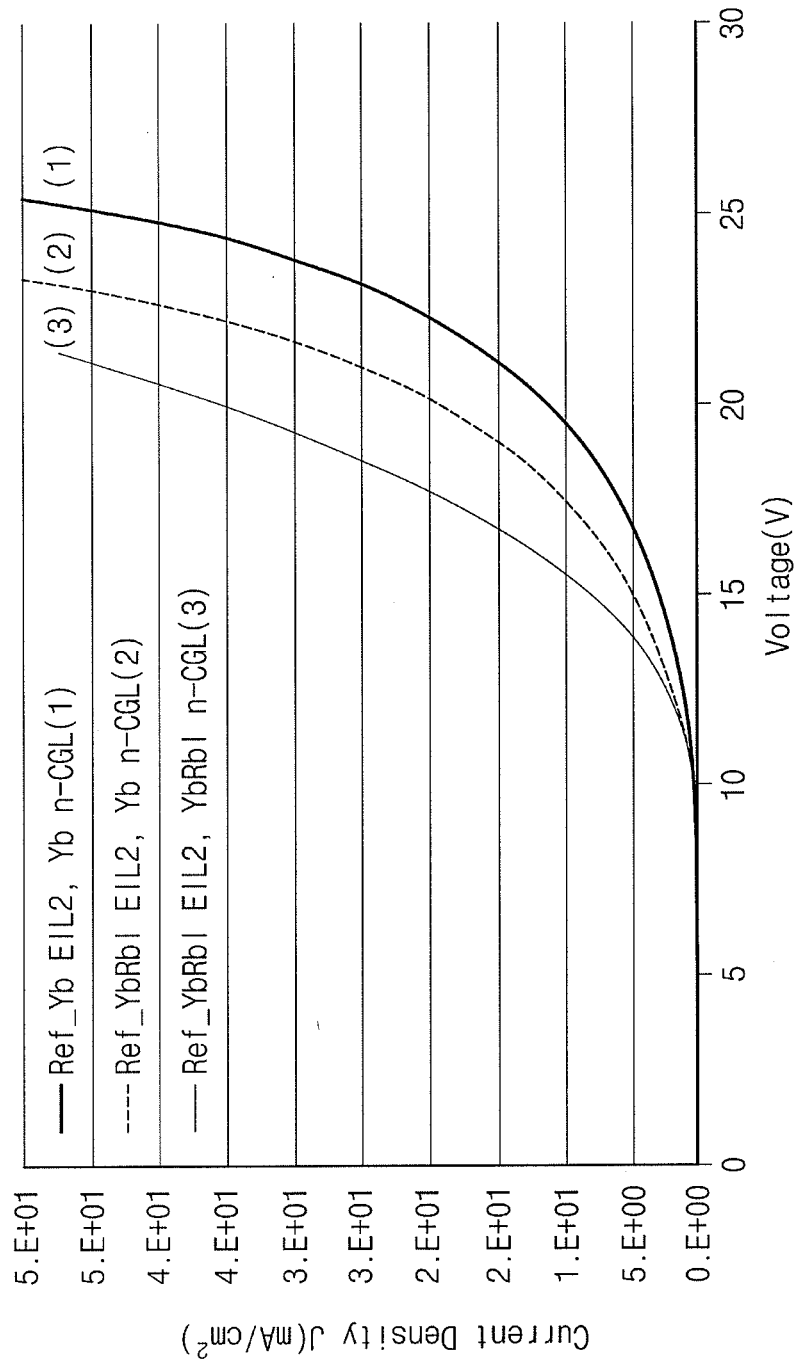
FIG. 7 illustrates a graph illustrating a change in driving efficiency according to current density.
Figure 8:
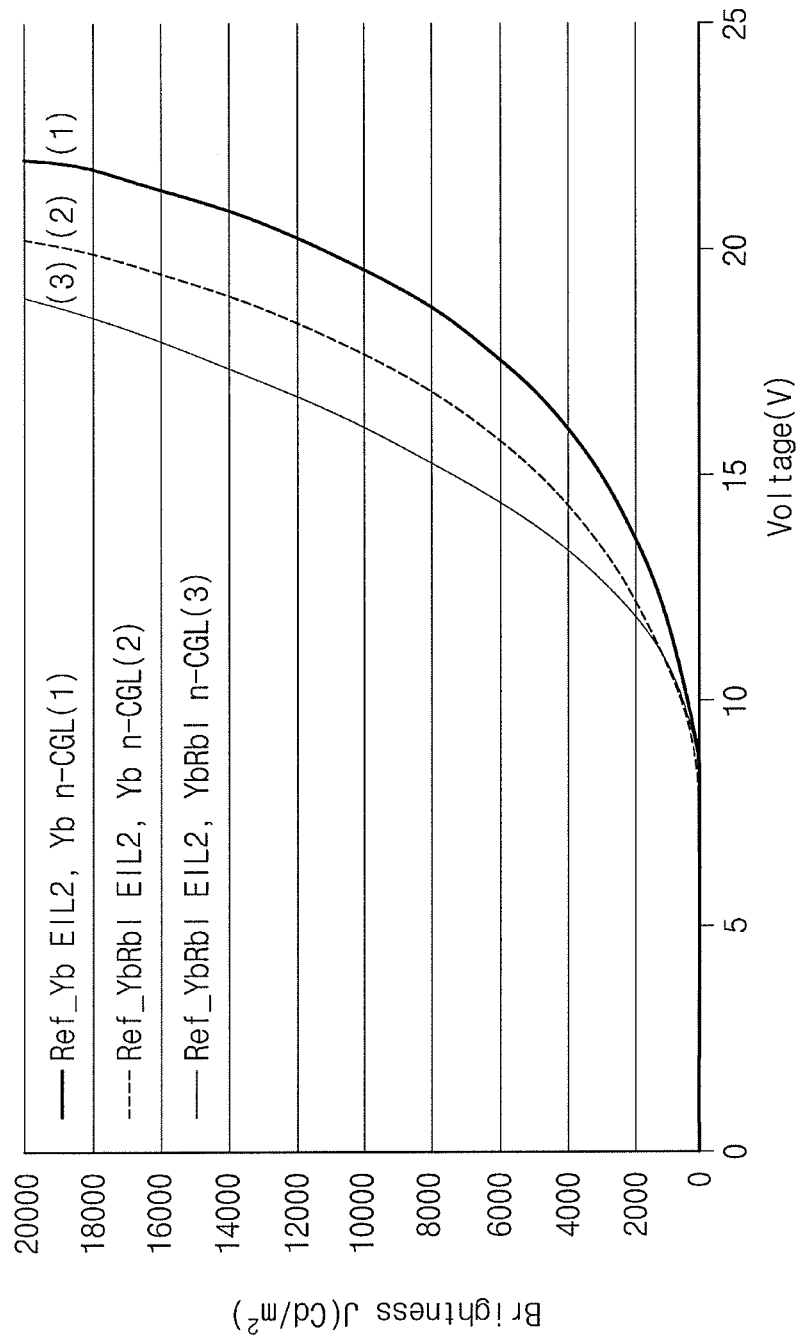
FIG. 8 illustrates a graph illustrating a change in driving efficiency according to brightness.
Figure 9:
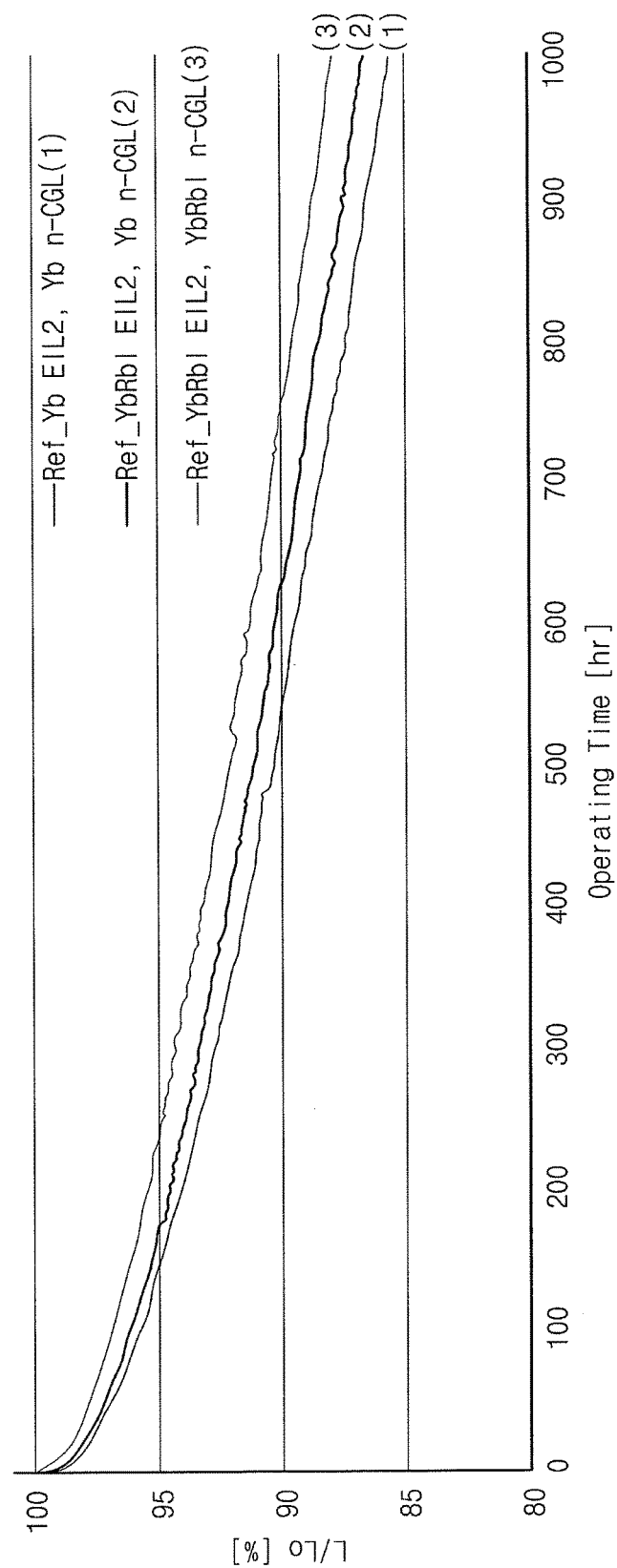
FIG. 9 illustrates a graph illustrating a change in operating time according to a brightness reduction ratio.

FIG. 7 is a graph illustrating a change in driving efficiency according to current density, FIG. 8 is a graph illustrating a change in driving efficiency according to brightness, and FIG. 9 is a graph illustrating a change in operating time according to a brightness reduction ratio.

FIGS. 7, 8, and 9 are graphs illustrating driving, brightness, and spectrum which were measured by manufacturing an organic light-emitting device including three light-emitting units in a size of 2 mm×2 mm. Specifically, voltage characteristics versus current of the organic light-emitting device were measured by using an EY 236 Source-Measure Unit and illustrated in the graph of FIG. 7. Brightness and spectrum versus driving voltage of the organic light-emitting device were measured by using an SR3-AR Spectrometer calibrated with a standard C light source and illustrated in the graph of FIG. 8. Driving, brightness, and spectrum versus a change in time were measured by using an SR3-AR Spectrometer calibrated with a standard C light source and illustrated in the graph of FIG. 9.

Referring to FIGS. 7, 8, and 9, (1) represents a graph of the organic light-emitting device OLED including ytterbium (Yb) in the first charge generation layer CGL-1 and the second electron injection layer EIL2, (2) represents a graph of the organic light-emitting device OLED including ytterbium (Yb) and the metal compound (RbI) having a perovskite structure in the second electron injection layer EIL2, and (3) represents a graph of the organic light-emitting device OLED including ytterbium (Yb) and the metal compound (RbI) having a perovskite structure in the first charge generation layer CGL-1.

Referring to FIG. 7, it may be understood that a driving voltage (bias, [V]) with respect to the same current density (J [mA/cm$^2$]) was the lowest in graph (3). That is, it may be understood that driving efficiency of the organic light-emitting device OLED including the metal compound in the first charge generation layer CGL-1 was better than that of the organic light-emitting device OLED which did not include the metal compound in the first charge generation layer CGL-1.

Referring to FIG. 8, it may be understood that a driving voltage with respect to the same brightness (cd/m$^2$) was the lowest in graph (3). That is, the organic light-emitting device OLED including a perovskite structure in the first charge generation layer CGL-1 may achieve predetermined brightness even at a low voltage.

In the graph of FIG. 9, lifespan of the organic light-emitting device OLED corresponding to each of graphs (1)

to (3) may be compared. That is, in a case in which the brightness reduction ratio was the same, it may be confirmed that operating time of the organic light-emitting device OLED corresponding to graph (3) was the longest.

Thus, it may be confirmed that the organic light-emitting device OLED including the material having a perovskite structure was advantageous in terms of the driving efficiency and lifespan.

An organic light-emitting device according to an embodiment of the present disclosure may improve driving efficiency by including a metal compound in a charge generation layer in which charges are generated and provided by a plurality of light-emitting units. Thus, the organic light-emitting device according to the embodiment of the present disclosure may provide a display apparatus having predetermined brightness or more even at a low voltage.

The present disclosure provides a white-light organic light-emitting device having improved luminous efficiency and lifespan. The present disclosure also provides a display apparatus which includes the white-light organic light-emitting device having improved luminous efficiency and lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
a first electrode;
a second electrode opposite to the first electrode;
a first light-emitter on the first electrode to emit first light of a first wavelength range;
a second light-emitter between the first light-emitter and the second electrode, the second light-emitter to emit second light of a second wavelength range; and
a charge generation layer, which includes a metal compound having a perovskite structure, disposed between the first light-emitter and the second light-emitter, the charge generating layer to generate charges to be provided to each of the first light-emitter and the second light-emitter.

2. The organic light-emitting device as claimed in claim 1, wherein:
the charges includes electrons and holes,
the charge generation layer includes a first charge generation layer to provide the electrons to the first light-emitter and a second charge generation layer to provide the holes to the second light-emitter, and
the metal compound is included in the first charge generation layer.

3. The organic light-emitting device as claimed in claim 2, wherein the first charge generation layer further includes at least one of a metal chelate compound, an oxadiazole dendrimer-based compound, an oxadiazole-based compound, an azole-based compound, a benzimidazole-based compound, a pyridine-based compound, a quinoline-based compound, an anthrazoline-based compound, a silole-based compound, or a cyan-based compound.

4. The organic light-emitting device as claimed in claim 2, wherein the first charge generation layer further includes at least one of magnesium (Mg), aluminum (Al), lithium (Li), calcium (Ca), silver (Ag), gold (Au), CaO, $MoO_x$, $TiO_x$, or $ZnO_x$, wherein x is a natural number selected from 2 and 3.

5. The organic light-emitting device as claimed in claim 1, wherein:
the first light-emitter includes a first emission layer to emit the first light, a first hole transport region between the first electrode and the first emission layer, and a first electron transport region between the first emission layer and the charge generation layer, and
the second light-emitter includes a second emission layer to emit the second light, a second hole transport region between the charge generation layer and the second emission layer, and a second electron transport region between the second electrode and the second emission layer.

6. The organic light-emitting device as claimed in claim 5, wherein:
the first electron transport region includes a first electron injection layer adjacent to the charge generation layer, and a first electron transport layer between the first electron injection layer and the first emission layer, and
the second electron transport region includes a second electron injection layer adjacent to the second electrode, and a second electron transport layer between the second electron injection layer and the second emission layer.

7. The organic light-emitting device as claimed in claim 6, wherein the second electron injection layer includes the metal compound.

8. The organic light-emitting device as claimed in claim 1, wherein the metal compound includes at least one of $CH_3NH_3PbBr_3$, $CH_3NH_3PbI_3$, $CH_3NH_3RbYbI_3$, $CH_3NH_3CSRbI_3$, or $CH_3NH_3CSYbI_3$.

9. The organic light-emitting device as claimed in claim 1, wherein one layer in at least of the first light emitter and the second light-emitter includes the metal compound.

10. An organic light-emitting device, comprising:
a first electrode;
a second electrode opposite to the first electrode;
a first light-emitter on the first electrode, the first light-emitter to emit first light of a first wavelength range;
a second light-emitter on the first light-emitter, the second light-emitter to emit second light of a second wavelength range;
a third light-emitter between the second light-emitter and the second electrode, the third light-emitter to emit light of a third wavelength range;
a first intermediate layer between the first light-emitter and the second light-emitter; and
a second intermediate layer between the second light-emitter and the third light-emitter,
wherein at least one of the first intermediate layer or the second intermediate layer includes a metal compound having a perovskite structure.

11. The organic light-emitting device as claimed in claim 10, wherein:
the first intermediate layer includes a first charge generation layer to generate electrons to be provided to the first light-emitter, and a second charge generation layer to generate holes to be provided to the second light-emitter, the second intermediate layer include a third charge generation layer to generates electron to be provided to the second light-emitter, and a fourth charge generation layer to generate holes to be provided to the third light-emitter, and the metal compound is included in at least one of the first charge generation layer or the third charge generation layer.

12. The organic light-emitting device as claimed in claim 10, wherein the metal compound includes at least one of $CH_3NH_3PbBr_3$, $CH_3NH_3PbI_3$, $CH_3NH_3RbYbI_3$, $CH_3NH_3CSRbI_3$, or $CH_3NH_3CSYbI_3$.

13. The organic light-emitting device as claimed in claim 10, wherein both the first intermediate layer and the second intermediate layer include the metal compound.

14. The organic light-emitting device as claimed in claim 10, wherein one layer in at least of the first to third light-emitters includes the metal compound.

* * * * *